(12) United States Patent
Mizuno et al.

(10) Patent No.: US 7,894,165 B2
(45) Date of Patent: Feb. 22, 2011

(54) CCP MAGNETORESISTIVE EFFECT DEVICE WITH FE BARRIER LAYERS INHIBITING DIFFUSION OF CO ATOMS TO HEUSLER ALLOY LAYERS IN FIXED LAYER AND FREE LAYER, AND HEAD, HEAD-GIMBAL ASSEMBLY AND HARD DISK SYSTEM INCLUDING SAID DEVICE

(75) Inventors: Tomohito Mizuno, Tokyo (JP); Yoshihiro Tsuchiya, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 923 days.

(21) Appl. No.: 11/762,457

(22) Filed: Jun. 13, 2007

(65) Prior Publication Data

US 2008/0019060 A1 Jan. 24, 2008

(30) Foreign Application Priority Data

Jul. 20, 2006 (JP) .............................. 2006-198070

(51) Int. Cl.
*G11B 5/39* (2006.01)
(52) U.S. Cl. .............................. 360/324.11; 360/324.12
(58) Field of Classification Search ............ 360/324.12, 360/324.11
See application file for complete search history.

(56) References Cited

U.S. PATENT DOCUMENTS

2005/0074634 A1* 4/2005 Hasegawa et al. ........ 428/694 T

2006/0067017 A1* 3/2006 Yuasa et al. ............ 360/324.12

(Continued)

FOREIGN PATENT DOCUMENTS

JP 2005-51251 2/2005

(Continued)

OTHER PUBLICATIONS

Machine translation of Saito (JP 2005-51251 A).*

(Continued)

*Primary Examiner*—Julie Anne Watko
(74) *Attorney, Agent, or Firm*—Oblon, Spivak, McClelland, Maier & Neustadt, L.L.P.

(57) ABSTRACT

The invention provides a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein an Fe layer is formed on one of both planes of said Heusler alloy layer in the stacking direction, wherein said one plane is near to at least a nonmagnetic spacer layer side, and said fixed magnetization layer is made up of a multilayer structure including a Heusler alloy layer, wherein Fe layers are formed on both plane sides of said Heusler alloy layer in the stacking direction with said Heusler alloy layer sandwiched between them. It is thus possible to prevent diffusion of Co atoms contained in the CoFe layer into the Heusler alloy layer, enabling the decrease in the spin polarizability of the Heusler alloy layer to be hold back and achieving a high MR ratio.

10 Claims, 12 Drawing Sheets

U.S. PATENT DOCUMENTS

2006/0285258 A1* 12/2006 Nishimura et al. ....... 360/324.1
2007/0230070 A1* 10/2007 Mizuno et al. ......... 360/324.12
2007/0242396 A1* 10/2007 Shimazawa et al. .... 360/324.12
2007/0268632 A1* 11/2007 Jogo et al. ............. 360/324.12

FOREIGN PATENT DOCUMENTS

JP          2005-116701          4/2005

OTHER PUBLICATIONS

U.S. Appl. No. 11/870,097, filed Oct. 10, 2007, Shimazawa, et al.
U.S. Appl. No. 11/931,219, filed Oct. 31, 2007, Shimazawa, et al.
U.S. Appl. No. 11/934,979, filed Nov. 5, 2007, Mizuno, et al.
U.S. Appl. No. 11/968,911, filed Jan. 3, 2008, Tsuchiya, et al.
U.S. Appl. No. 12/128,352, filed May 28, 2008, Mizuno, et al.
U.S. Appl. No. 11/768,435, filed Jun. 26, 2007, Tsuchiya, et al.
U.S. Appl. No. 11/757,174, filed Jun. 1, 2007, Tsuchiya, et al.
U.S. Appl. No. 11/626,562, filed Jan. 24, 2007, Hara, et al.

* cited by examiner

CCP MAGNETORESISTIVE EFFECT DEVICE WITH FE BARRIER LAYERS INHIBITING DIFFUSION OF CO ATOMS TO HEUSLER ALLOY LAYERS IN FIXED LAYER AND FREE LAYER, AND HEAD, HEAD-GIMBAL ASSEMBLY AND HARD DISK SYSTEM INCLUDING SAID DEVICE

BACKGROUND OF THE INVENTION

1. Field of the Invention

The present invention relates to a magneto-resistive effect device for reading the magnetic field strength of a magnetic recording medium or the like as signals and a thin-film magnetic head comprising that magneto-resistive effect device as well as a head gimbal assembly and a magnetic disk system comprising that thin-film magnetic head.

2. Explanation of the Prior Art

With recent improvements in the plane recording density of hard disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinned layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinned layer (antiferromagnetic layer). In a preferable embodiment of the fixed magnetization layer, it is made up of a synthetic ferrimagnet with a nonmagnetic intermediate layer sandwiched between an inner and an outer layer. The synthetic ferrimagnet is sometimes called a synthetic pinned layer.

Incidentally, common GMR heads used so far in the art have a CIP (current in plane) structure wherein a current for detecting magnetic signals (the so-called sense current) is passed parallel with the plane of each of the layers forming the GMR device. On the other hand, GMR devices having the so-called CPP (current perpendicular to plane) structure wherein the sense current is passed perpendicularly (stacking direction) to the plane of each of the layers forming the GMR device, too, are now under development as next-generation ones. The aforesaid TMR devices, too, would come under the CPP structure category.

In the GMR devices proposed so far in the art, the free layer and fixed magnetization layer are still composed mainly of CoFe alloys, NiFe alloys or the like. Referring to such GMR devices of the CPP structure, even when they have a multi-layer structure capable of achieving practical reproduction gap lengths, the magneto-resistivity change ratio (MR ratio)—the ratio of a magneto-resistivity change with respect to resistance—is barely about 4%, a figure still practically less than satisfactory. A possible reason why the MR ratio of conventional GMR devices of the CPP structure is small could be that the spin polarizability of CoFe or NiFe alloys used as the material for the free layer and fixed magnetization layers is small.

To increase the MR ratio of the GMR devices of the CPP structure, it has recently been proposed to use as the material for the free layer and fixed magnetization layer a Heusler alloy that is a sort of half-metal with its spin polarizability close to 1 (JP-A's 2005-51251 and 2005-116701). In this case, it has also been proposed to interleave a CoFe alloy between a nonmagnetic layer (spacer layer) and the Heusler alloy.

In general, when a Heusler alloy such as CoMnSi or CoMnGe is used for the free layer and inner layer in a GMR device, it must be combined with a CoFe alloy for the inner layer so as to achieve a good antiferromagnetic coupling by way of a nonmagnetic intermediate layer and prevent diffusion of Cu from a nonmagnetic layer (spacer layer), whereas it must be combined with a CoFe alloy for the free layer so as to prevent diffusion of Cu from the nonmagnetic layer (spacer layer).

However, it has now been found through inventors' experimentation that when the Heusler alloy layer is formed in tight contact with the CoFe alloy layer, Co atoms contained in the CoFe alloy diffuse into the Heusler alloy, resulting in the likelihood of bringing about inconvenience such as a decrease in the spin polarizability of the Heusler alloy.

The situations being like this, the present invention has for its object to provide a magneto-resistive effect device that works for prevention of diffusion of Co atoms contained in a CoFe alloy layer into a Heusler alloy layer, making the spin polarizability of the Heusler alloy layer less likely to go down and making sure high MR ratios and a thin-film magnetic head comprising that magneto-resistive effect device as well as a head gimbal assembly and a hard disk system including that thin-film magnetic head.

SUMMARY OF THE INVENTION

According to the invention, such an object is accomplished by the provision of a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and said fixed magnetization layer is made up of a multilayer structure including a Heusler alloy layer, wherein Fe layers are formed on both plane sides of said Heusler alloy layer in the stacking direction with said Heusler alloy layer sandwiched between them.

According to a preferable embodiment of the inventive magneto-resistive effect device of the CPP structure, in said fixed magnetization layer, Co alloy layers containing Co are formed on surfaces of the Fe layers with said Heusler alloy layer sandwiched between them, wherein said surfaces face away from the surfaces of the Fe layers in contact with said Heusler alloy layer.

In another preferable embodiment of the inventive magneto-resistive effect device of the CPP structure, said fixed magnetization layer has a form wherein an inner layer and an outer layer are stacked one upon another with a nonmagnetic intermediate layer sandwiched between them, wherein said inner layer is located at a position nearer to said nonmagnetic spacer layer than said outer layer, and said inner layer has a multilayer structure comprising said Heusler alloy layer, said Fe layers, and said Co alloy layers.

In yet another preferable embodiment of the inventive magneto-resistive effect device of the CPP structure, said outer layer includes a ferromagnetic layer having a fixed magnetization direction, and the magnetization direction of each of said Heusler alloy layer, said Fe layers, and said Co alloy layers in said inner layer is fixed in the direction (antiparallel direction) opposite to the magnetization direction of the ferromagnetic layer in said outer layer.

In a further preferable embodiment of the inventive magneto-resistive effect device of the CPP structure, the fixation of the magnetization direction of the ferromagnetic layer in said outer layer is carried out by the action of an antiferromagnetic layer formed in contact with said outer layer.

In a further preferable embodiment of the inventive magneto-resistive effect device of the CPP structure, said nonmagnetic spacer layer is made of an electroconductive material.

In a further preferable embodiment of the inventive magneto-resistive effect device of the CPP structure, a multilayer structure of said Fe layers and said Co alloy layers in said fixed magnetization layer has an Fe concentration gradient such that the sides of the Fe layers in contact with the Heusler alloy layer grow richest in Fe by heat treatment.

In a further preferable embodiment of the inventive magneto-resistive effect device of the CPP structure, said heat treatment is annealing at higher than 320° C.

The present invention also provides a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein an Fe layer is formed on one of both planes of said Heusler alloy layer in the stacking direction, wherein said one plane is near to at least a nonmagnetic spacer layer side.

Further, the present invention provides a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein an Fe layer is formed on one of both planes of said Heusler alloy layer in the stacking direction, wherein said one plane is near to at least a nonmagnetic spacer layer side, and said fixed magnetization layer is made up of a multilayer structure including a Heusler alloy layer, wherein Fe layers are formed on both plane sides of said Heusler alloy layer in the stacking direction with said Heusler alloy layer sandwiched between them.

Furthermore, the present invention provides a thin-film magnetic head, comprising a medium opposite plane in opposition to a recording medium, the aforesaid magneto-resistive effect device of the CPP structure that is located near said medium opposite plane so as to detect a signal magnetic field from said recording medium, and a pair of electrodes for passing a current in the stacking direction of said magneto-resistive effect device.

Furthermore, the present invention provides a head gimbal assembly, comprising a slider including the aforesaid thin-film magnetic head and located in opposition to a recording medium, and a suspension adapted to resiliently support said slider.

Furthermore, the present invention provides a hard disk system, comprising a slider including the aforesaid thin-film magnetic head and located in opposition to a recording medium, and a positioning device adapted to support and position said slider with respect to said recording medium.

As described above, the present invention provides a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein an Fe layer is formed on one of both planes of said Heusler alloy layer in the stacking direction, wherein said one plane is near to at least a nonmagnetic spacer layer side, and said fixed magnetization layer is made up of a multilayer structure including a Heusler alloy layer, wherein Fe layers are formed on both plane sides of said Heusler alloy layer in the stacking direction with said Heusler alloy layer sandwiched between them. It is thus possible to prevent diffusion of Co atoms contained in the CoFe layer into the Heusler alloy layer, making it possible to reduce a decrease in the spin polarizability of the Heusler alloy layer and achieving a high MR ratio.

DETAILED EXPLANATION OF THE INVENTION

The best mode for carrying out the invention is now explained in details.

Figure 1:
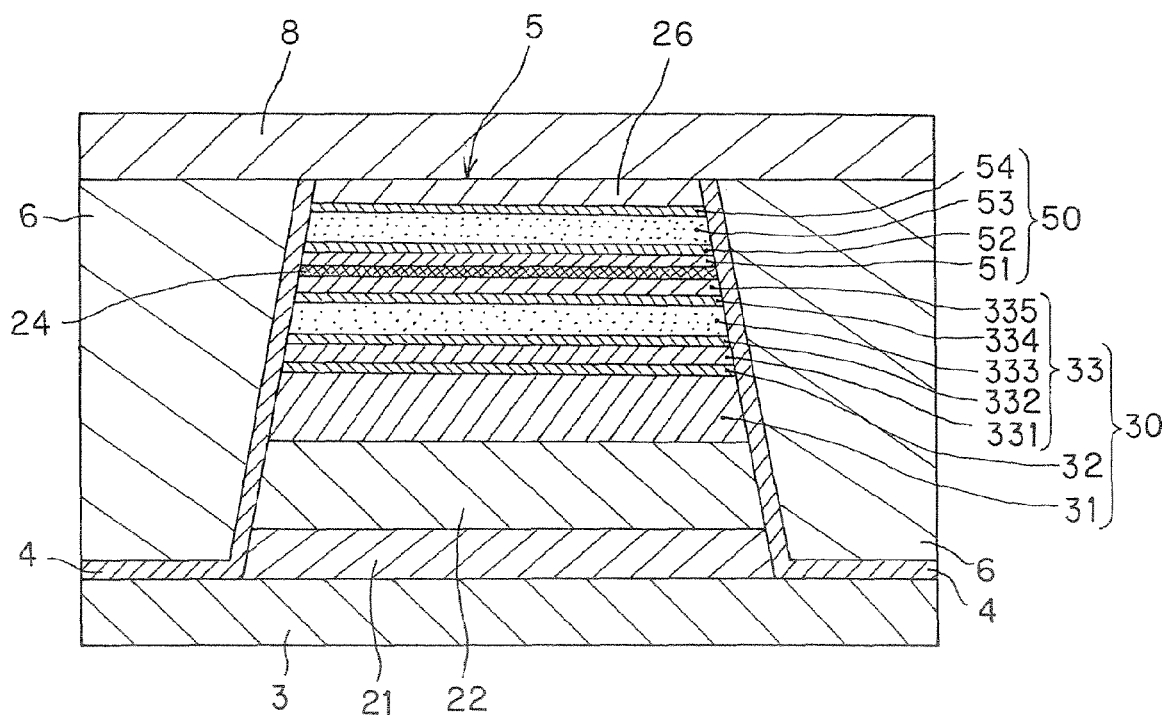
FIG. 1 is a sectional view illustrative of a section of an embodiment of the invention in particular, parallel with the plane of a reproducing head in opposition to a medium.

FIG. 1 is illustrative of the ABS (air bearing surface) of a reproducing head in an embodiment of the invention in general; FIG. 1 is illustrative in schematic of the ABS of the magneto-resistive effect device having a CPP structure—part of the invention in particular. An ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
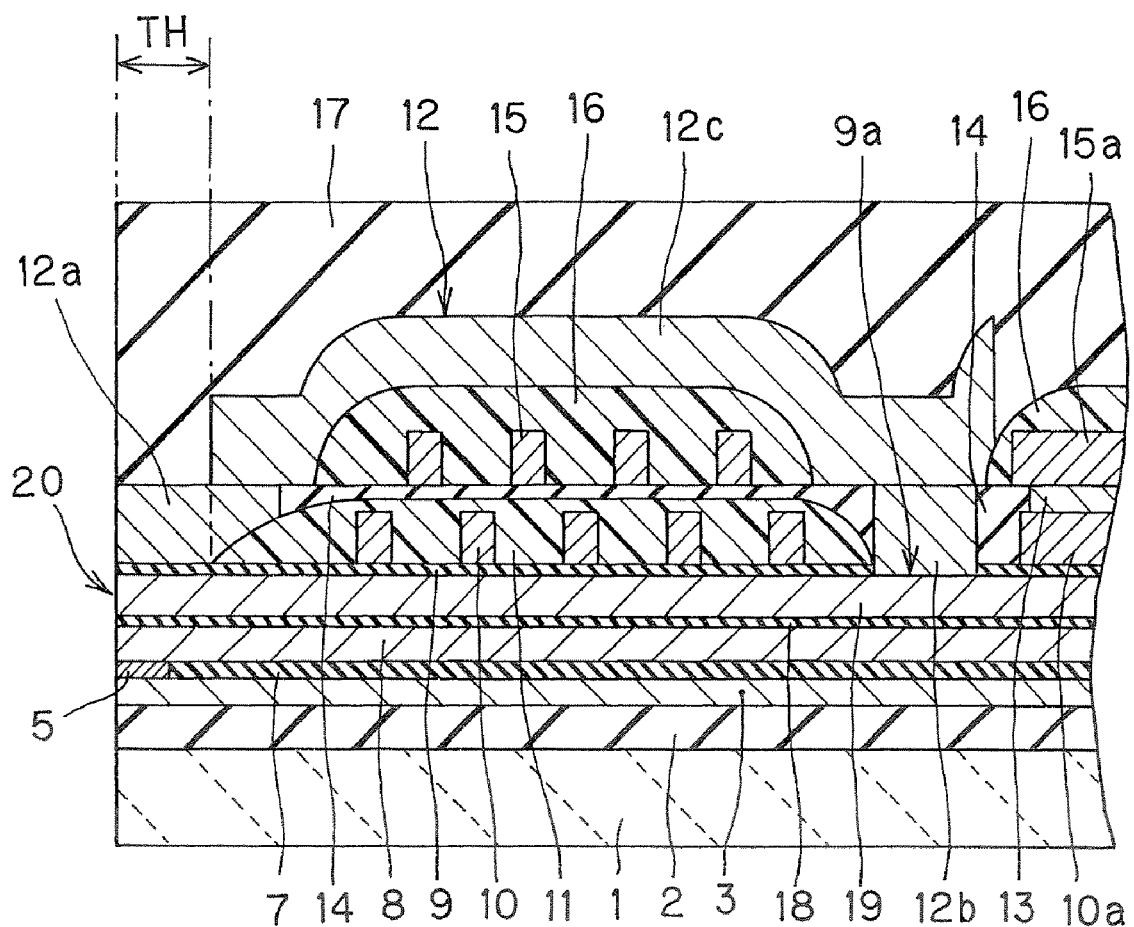
FIG. 2 is illustrative of the construction of a thin-film magnetic head according to one preferable embodiment of the invention; it is a sectional view illustrative of the plane of the thin-film magnetic head in opposition to the medium and a section thereof vertical to a substrate.
Figure 3:
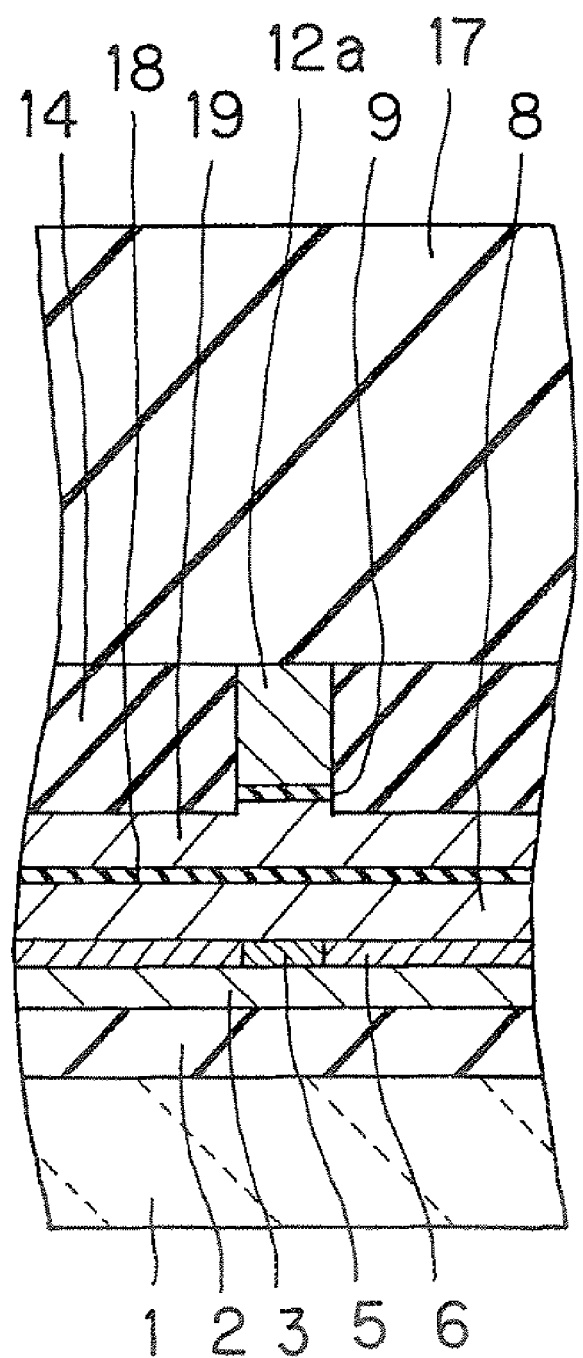
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.
Figure 4:
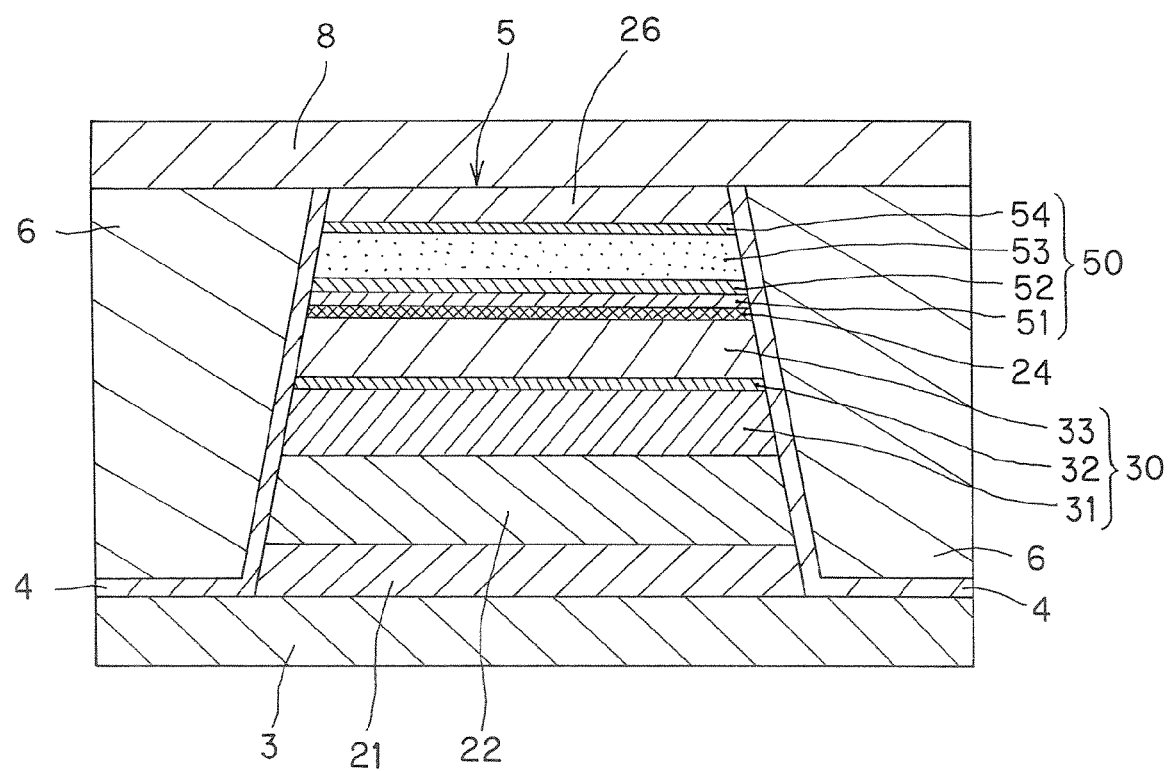
FIG. 4 is illustrative of a section of another embodiment of the invention in particular, parallel with the medium opposite plane of a reproducing head; it is corresponding to one modification to FIG. 1.
Figure 5:
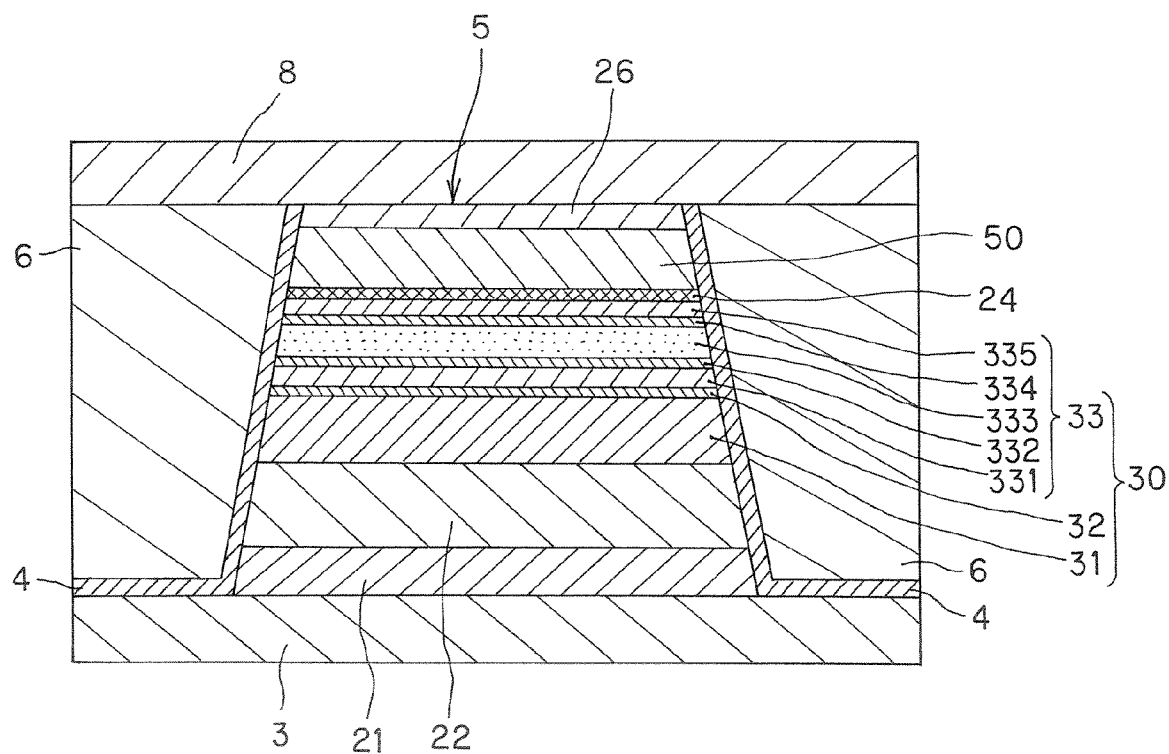
FIG. 5 is illustrative of a section of yet another embodiment of the invention in particular, parallel with the medium opposite plane of a reproducing head; it is corresponding to another modification to FIG. 1.
Figure 6:
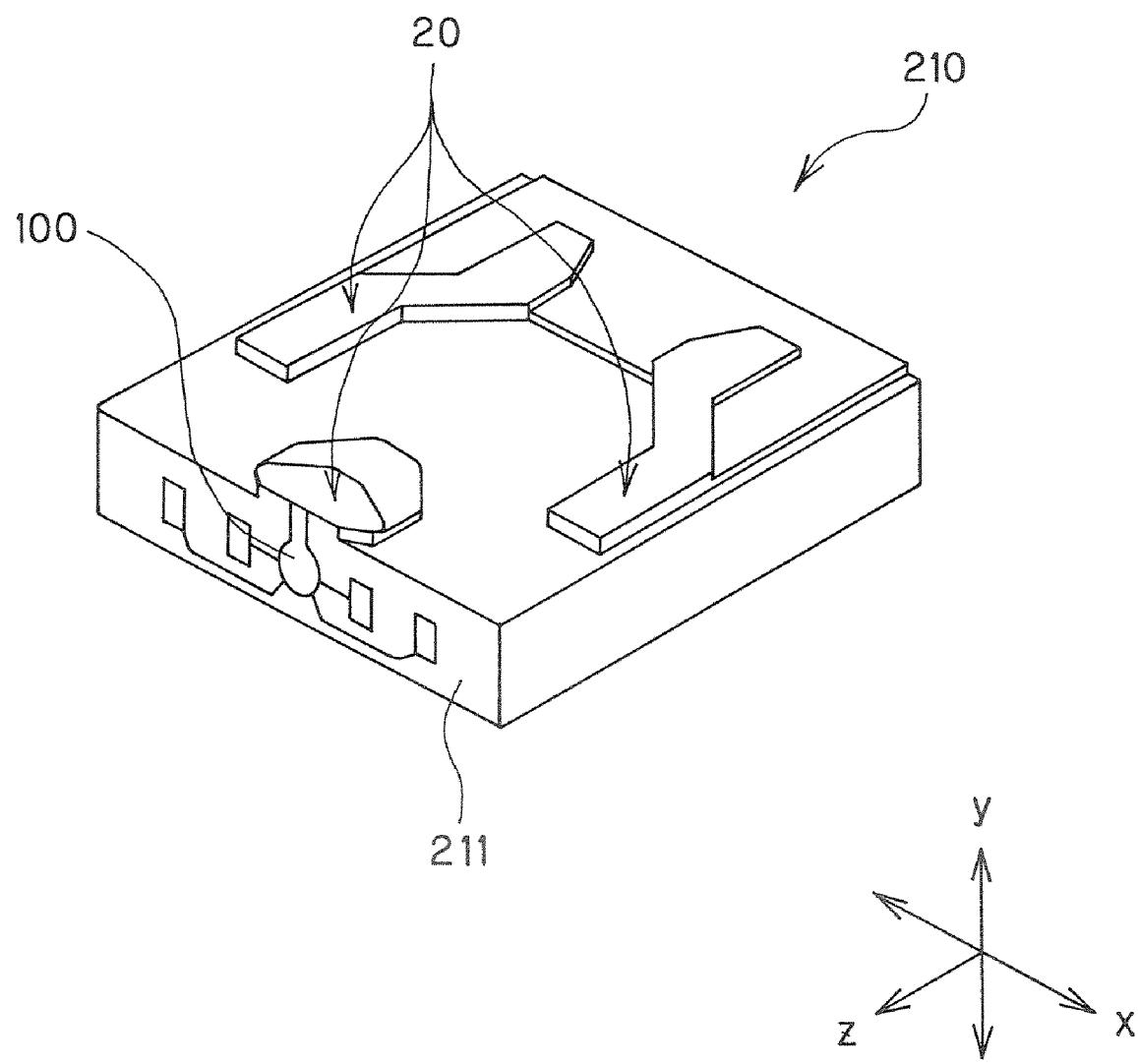
FIG. 6 is a perspective view of a slider built in the head gimbal assembly according to one embodiment of the invention.
Figure 7:
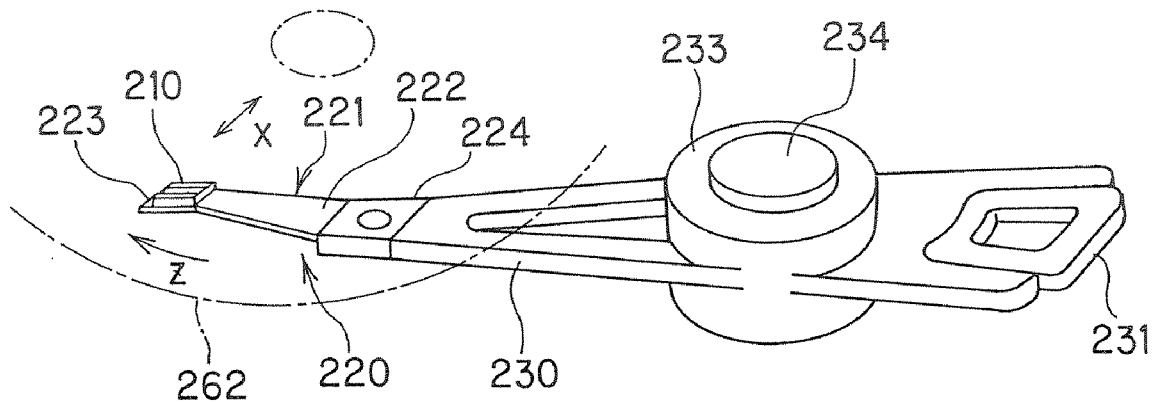
FIG. 7 is a perspective view of a head arm assembly including the head gimbal assembly according to one embodiment of the invention.
Figure 8:
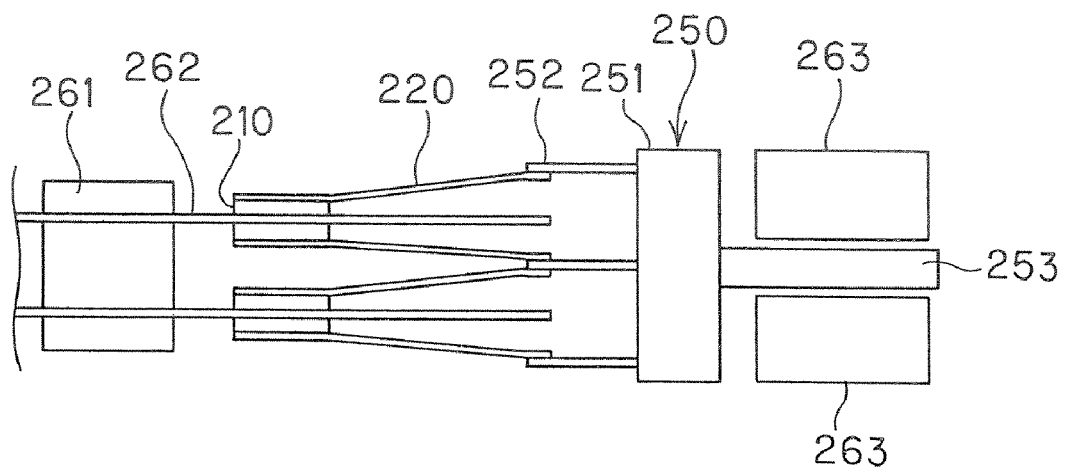
FIG. 8 is illustrative of part of the hard disk system according to one embodiment of the invention.
Figure 9:
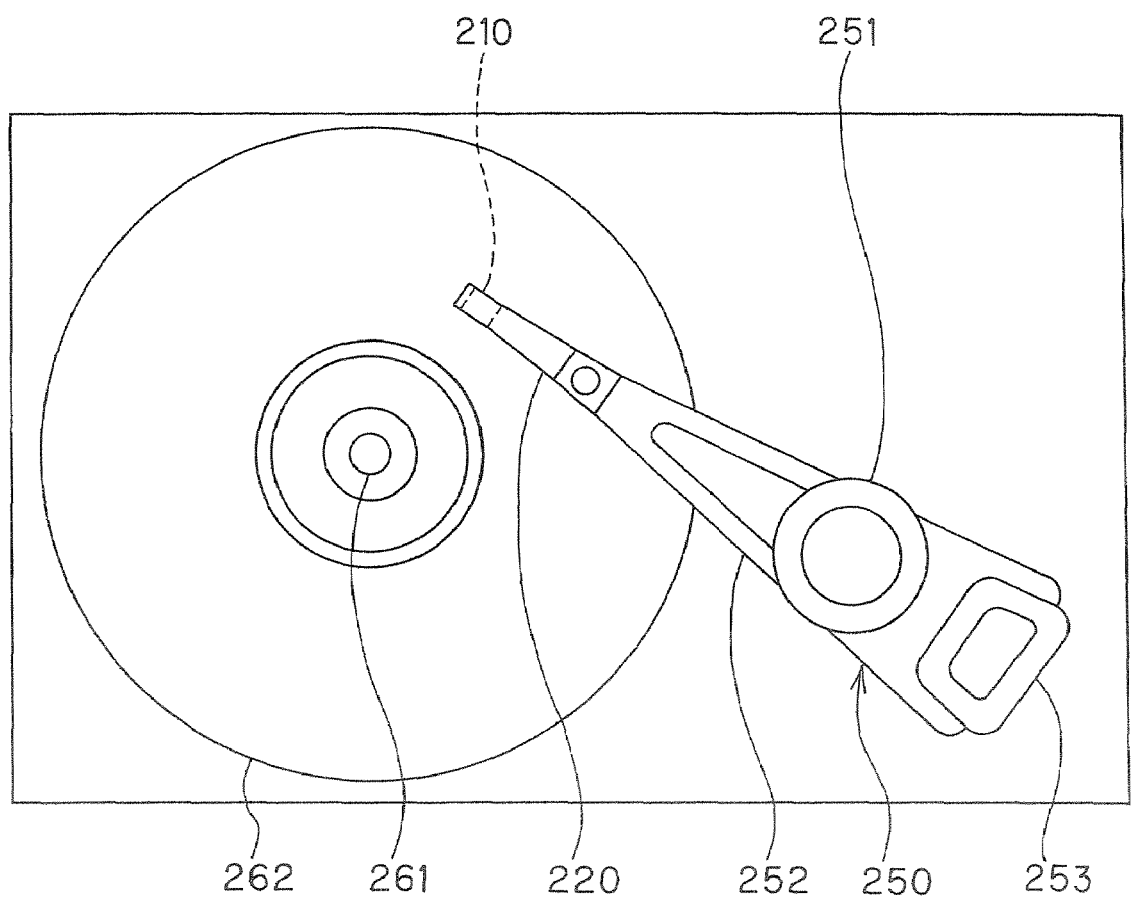
FIG. 9 is a plan view of the hard disk system according to one embodiment of the invention.

FIG. 2 is illustrative of the construction of the thin-film magnetic head according to one preferable embodiment of the invention; it is a sectional view illustrative of a section of the thin-film magnetic head vertical to the ABS and substrate. FIG. 3 is illustrative of the construction of the thin-film magnetic head according to one preferable embodiment of the invention in general; it is a sectional view illustrative of a section of a magnetic pole portion of the thin-film magnetic head parallel with the ABS in particular. FIG. 4 is illustrative of a modification to FIG. 1; it is illustrative of a modified embodiment of the magneto-resistive effect device—part of the invention, as viewed from the ABS. FIG. 5 is illustrative of another modification to FIG. 1; it is illustrative of another modified embodiment of the magneto-resistive effect device—part of the invention, as viewed from the ABS. FIG. 6 is a perspective view of a slider built in the head gimbal assembly according to one embodiment of the invention; FIG. 7 is a perspective view of a head arm assembly including the head gimbal assembly according to one embodiment of the invention; FIG. 8 is illustrative of part of the hard disk system according to one embodiment of the invention; and FIG. 9 is a plan view of the hard disk system according to one embodiment of the invention.

Magneto-Resistive Effect Device Having a CPP Structure According to the First Embodiment The construction of a reproducing head comprising the inventive magneto-resistive effect device of the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed to each other, a magneto-resistive effect device 5 (hereinafter referred simply to as the MR device 5) interleaved between the first shield layer 3 and the second shield layer 8, an insulating film 4 adapted to cover two sides of the MR device 5 and a part of the upper surface of the first shield layer 3 along these sides, and two bias magnetic field-applying layers 6 adjacent to the two sides of the MR device 5 via the insulating layer 4. The first 3 and the second shield layer 8 take a so-called magnetic shield role plus a pair-of-electrodes role. In other words, they have not only a function of shielding magnetism but also function as a pair of electrodes adapted to pass a sense current through the MR device in a direction intersecting the plane of each of the layers forming the MR device 5, for instance, in a direction perpendicular to the plane of each of the layers forming the MR device (stacking direction).

Apart from the first 3 and the second shield layer 8, another pair of electrodes may be additionally provided above and below the MR device.

The reproducing head of the invention includes the GMR device 5 of the CPP structure—part of the invention.

Referring to the inventive MR device 5 of the CPP structure in terms of a broad, easy-to-understand concept, it comprises a nonmagnetic spacer layer 24, and a fixed magnetization layer 30 and a free layer 50 that are stacked one upon another with the nonmagnetic spacer layer 24 held between them. And then, a sense current is applied to the MR device 5 in its stacking direction to enable its function. In short, there is the MR device 5 of the CPP (current perpendicular to plane) structure involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22.

(Explanation of the Fixed Magnetization Layer 30)

In the invention, the fixed magnetization layer 30 is formed on the antiferromagnetic layer 22 having a pinning action via an underlay layer 21 formed on the first shield layer 3. The fixed magnetization layer 30 has a so-called synthetic pinned layer comprising, in order from the side of the antiferromagnetic layer 22, an outer layer 31, a nonmagnetic intermediate layer 32 and an inner layer 33, all stacked together in order.

And, the inner layer 33 in the inventive fixed magnetization layer 30 is characterized by being made up of a multilayer structure including a Heusler alloy layer 333, as shown in FIG. 1, wherein Fe layers 332, 334 are formed on both planar sides of the Heusler alloy layer 333 in the stacking direction while the Heusler alloy layer 333 is sandwiched between them. To be more specific, the inner layer 33 in the inventive fixed magnetization layer 30 is made up of a multilayer structure comprising, in order from the side of the nonmagnetic intermediate layer 32, an underlay magnetic layer 331, Fe layer 332, Heusler alloy layer 333, Fe layer 334 and an intermediate magnetic layer 335.

Each of the aforesaid layers is now explained in greater details.

Outer Layer 31

The outer layer 31 is provided by a ferromagnetic layer made of a ferromagnetic material containing Co. The outer 31 and the inner layer 33 are antiferromagnetically coupled and fixed such that their magnetization directions are opposite to each other.

The outer 31 is preferably made of, for instance, a $Co_{70}Fe_{30}$ (atomic %) alloy, and has a thickness of preferably about 3 to 7 nm.

Nonmagnetic Intermediate Layer 32

For instance, the nonmagnetic intermediate layer 32 is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses not only two such magnetizations in just opposite directions of 180° but those in different directions of 180°±20° as well.

Inner Layer 33

(i) Underlay Magnetic Layer 331

The underlay magnetic layer 331 is made of a Co alloy containing Co. For instance, it should preferably be a magnetic alloy layer of the body-centered cubic structure made of a CoFe alloy. The content of Fe should preferably be equal to or greater than 30 at %. A preferable example is an alloy layer of $Co_{70}Fe_{30}$ (at %). The underlay magnetic layer 331 should have a thickness of about 1 to 2 nm.

(ii) Fe Layers 332, 334

The Fe layers 332, 334 with the Heusler alloy layer 333 sandwiched between them is made of a substantially pure iron. The phrase "substantially pure iron" means that iron may contain impurities in such a range that does not work against the advantage of, and the requirement for, the invention. Note here that the chief objective of the Fe layers 332, 334 is to enable them to function as so-called blocking layers for preventing diffusion of Co atoms from the adjacent Co-containing layer into the Heusler alloy layer 53. As the Co atoms diffuse into the Heusler alloy layer 53, it causes inconvenience: a drop of spin polarizability. In this conjunction, it has been experimentally found that the diffusion of Fe atoms in the Heusler alloy layer 53 has no or little risk of lowering the spin polarizability, as can be appreciated from the experimental examples, given later.

(iii) Heusler Alloy Layer 333

The following Heusler alloys could be used.

(1) Heusler Alloy Having a Composition Formula: $X_2YZ$

Here X is one element selected from the groups IIIA to IIB of the periodic table; Y is Mn; and Z is one or two or more elements selected from Al, Si, Ga, Ge, In, Sn, Tl, Pb, and Sb.

The aforesaid Heusler alloy is of the L2 or B2 crystal structure.

(2) Heusler Alloy Having a Composition Formula: XYZ

Here X is one element selected from the groups IIIA to IIB of the periodic table; Y is Mn; and Z is one or two or more elements selected from Al, Si, Ga, Ge, In, Sn, Tl, Pb, and Sb.

The aforesaid Heusler alloy is of the C1b crystal structure.

In the invention, preference is given to $Co_2MnSi$, $Co_2MnGe$, $Co_2MnSn$, $Co_2MnSb$, and $Co_2Mn(SiGe)$ out of the aforesaid Heusler alloys, and most preference is given to $Co_2MnSi$, and $Co_2MnGe$, each of the L2 or B2 structure.

Such Heusler alloy layers should have a thickness of about 1 to 7 nm.

(iv) Intermediate Magnetic Layer 335

The intermediate magnetic layer 335 should preferably be a Co alloy layer containing Co. The content of Co should preferably be 30 to 50 at %, because a relatively high polarizability is obtainable in that range. A preferable example is an alloy layer of $FeCo_{30-50}$ having a thickness of about 0.5 to 2 nm.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn should preferably be 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 should have a thickness of about 5 to 30 nm.

(Explanation of the Nonmagnetic Spacer Layer 24)

The nonmagnetic spacer layer 24 is interleaved between the fixed magnetization layer 30 and the free layer 50. For instance, the nonmagnetic spacer layer 24 is made of a nonmagnetic, electroconductive material containing at least 80% by weight of at least one out of the group consisting of Cu, Au and Ag, and should preferably have a thickness of about 1 to 4 nm.

(Explanation of the Free Layer 50)

In the invention, the free layer 50 includes on the nonmagnetic spacer layer 24 a multilayer structure comprising an underlay magnetic layer 51, an Fe layer 52, a Heusler alloy layer 53 and an Fe layer 54 stacked one upon another in order, as shown in FIG. 1.

Underlay Magnetic Layer 51

The underlay magnetic layer 51 is made of a Co-containing alloy, and should preferably be a magnetic alloy layer of the body-centered cubic structure comprising, for instance, a CoFe alloy. The content of Co should preferably be 50 to 70 at %, because, in that range, high polarizability is obtained, and there is a decreased coercive force property obtained, which is needed for the free layer. A preferable example is an alloy layer of $Co_{50-70}Fe$ (at %) with a thickness of about 0.5 to 2 nm.

Fe Layers 52, 54

The Fe layers 52, 54 with the Heusler alloy layer 53 sandwiched between them is made of a substantially pure iron. The phrase "substantially pure iron" means that iron may contain impurities in such a range that does not work against the advantage of, and the requirement for, the invention. Note here that the chief objective of the Fe layers 52, 54 is to enable them to function as so-called blocking layers for preventing diffusion of Co atoms from the adjacent Co-containing layer into the Heusler alloy layer 53. For this reason, it is possible to dispense with the formation of the Fe layer 54 on the upper side of the drawing, where there would be no or little diffusion of Co. To put it another way, the Fe layer may just as well be formed on one of both planes of the Heusler alloy layer 53 in the stacking direction, wherein said one plane is near to the side of the non-magnetic spacer layer 24.

Heusler Alloy Layer 53

The following Heusler alloys could be used.

(1) Heusler Alloy Having a Composition Formula: $X_2YZ$

Here X is one element selected from the groups IIIA to IIB of the periodic table; Y is Mn; and Z is one or two or more elements selected from Al, Si, Ga, Ge, In, Sn, Tl, Pb, and Sb.

The aforesaid Heusler alloy is of the L2 or B2 crystal structure.

(2) Heusler Alloy Having a Composition Formula: XYZ

Here X is one element selected from the groups IIIA to IIB of the periodic table; Y is Mn; and Z is one or two or more elements selected from Al, Si, Ga, Ge, In, Sn, Tl, Pb, and Sb.

The aforesaid Heusler alloy is of the C1b crystal structure.

In the invention, preference is given to $Co_2MnSi$, $Co_2MnGe$, $Co_2MnSn$, $Co_2MnSb$, and $Co_2Mn(SiGe)$ out of the aforesaid Heusler alloys, and most preference is given to $Co_2MnSi$, and $Co_2MnGe$, each of the L2 or B2 structure.

Such Heusler alloy layers should have a thickness of about 1 to 6 nm.

On the free layer 50 there is a protective layer 26 of, e.g., ruthenium formed with a thickness of about 0.5 to 10 nm.

The underlay layer 21 underlying the antimagnetic layer is provided to improve the crystallization and orientation of each layer formed on it. In particular, that layer is provided to better an exchange coupling between the antiferromagnetic layer 22 and the fixed magnetization layer 30. For such an underlay layer 21, a multilayer structure of, e.g., a Ta layer and a NiCr layer is used. The thickness of the underlay layer 21 should be about 2 to 6 nm.

For instance, the insulating layer 4 is made of alumina. For the bias magnetic field-applying layer 6, a hard magnetic layer (hard magnet) or a multilayer structure of a hard magnetic material and an anti-ferromagnetic layer is used. To be more specific, CoPt or CoCrPt may be used.

Magneto-Resistive Effect Device of the CPP Structure According to the Second Embodiment The magneto-resistive effective device of the CPP structure according to the second embodiment of the invention is now explained with reference to FIG. 4. The magneto-resistive effect device of the CPP structure according to the second embodiment shown in FIG. 4 differs from the aforesaid first embodiment in that a Heusler alloy layer 53 is applied to a free layer 50 alone. And of course, the Heusler alloy layer 53 is sandwiched between Fe layers 52 and 54.

More specifically, the magneto-resistive effect device of the CPP structure according to the second embodiment shown in FIG. 4 takes on a form that comprises, in order from the side of an underlay layer 21, an anti-ferromagnetic layer 22, an outer layer 31, a nonmagnetic intermediate layer 32, an inner layer 33, a nonmagnetic spacer layer 24, and a free layer 50 (a multilayer structure comprising underlay magnetic layer 51, Fe layer 52, Heusler alloy layer 53 and Fe layer 54) stacked one upon another.

In the second embodiment shown in FIG. 4, the inner layer 33 is made up of a single layer comprising a Co alloy layer containing Co. For instance, it is preferably a magnetic alloy layer comprising e.g., a CoFe alloy wherein the content of Fe is preferably 30 to 100 at %. In the second embodiment, the inner layer 33 should have a thickness of about 1 to 6 nm.

Referring to the materials and structures of the layers except the inner layer 33, the second embodiment may be much the same as the aforesaid first embodiment.

Magneto-Resistive Effect Device of the CPP Structure According to the Third Embodiment The magneto-resistive effective device of the CPP structure according to the third embodiment of the invention is now explained with reference to FIG. 5. The magneto-resistive effect device of the CPP structure according to the second embodiment shown in FIG. 5 differs from the aforesaid first embodiment in that a Heusler alloy layer 333 is applied to a fixed magnetization layer 30 alone. And of course, the Heusler alloy layer 333 is sandwiched between Fe layers 332 and 334.

More specifically, the magneto-resistive effect device of the CPP structure according to the third embodiment shown in FIG. 5 takes on a form that comprises, in order from the side of an underlay layer 21, an anti-ferromagnetic layer 22, an outer layer 31, a nonmagnetic intermediate layer 32, an inner layer 33 (a multilayer structure comprising underlay magnetic layer 331, Fe layer 332, Heusler alloy layer 333, Fe layer 334 and intermediate magnetic layer 335), a nonmagnetic spacer layer 24 and a free layer 50 stacked one upon another.

In the third embodiment shown in FIG. 5, the free layer 50 is made up of a single layer comprising a Co alloy layer containing Co. For instance, it is preferably a magnetic alloy layer comprising, e.g. a CoFe alloy wherein the content of Co is preferably 50 to 70 at %. In the third embodiment, the free layer 50 should have a thickness of about 1 to 6 nm.

Referring to the materials and structures of the layers except the free layer 50, the third embodiment may be much the same as the aforesaid first embodiment.

The magneto-resistive effect device (CPP-GMR device) of the CPP structure in the first, second and third embodiments of the invention as described above may be formed by means of vacuum film-formation techniques such as sputtering. If required, heat treatment may be applied after film-formation.

In the fixed magnetization layer 30 in each of the aforesaid first and third embodiments, the multilayer structure made up of the aforesaid Fe layer and the aforesaid Co alloy layer would often have an Fe concentration gradient such that the side of the Fe layer in contact with the Heusler alloy layer 333 grows richest in Fe by diffusion due to such heat treatment, although of course depending on the temperature conditions for that heat treatment (for instance, an annealing temperature of higher than 320° C.). That is, the multilayer structure made up of the underlay magnetic layer 331 and the Fe layer 332 or the multilayer structure made up of the intermediate magnetic layer 333 and the Fe layer 334 would often have an Fe concentration gradient such that the sides of the Fe layers 332, 334 in contact with the Heusler alloy layer 333 grows richest in Fe. Even when there is such a concentration gradient appearing, however, the "pure iron" moiety remains near the joining interfaces of the Fe layers 332, 334 in contact with the Heusler alloy layer 333: the advantages of the invention are still achievable. Such cases that there is an Fe concentration gradient appearing in the Fe layers 332, 334, too, are included in the possible embodiments of the invention, because the advantages of the invention are still achievable.

In the free layer 50 in each of the aforesaid first and second embodiments, too, the multilayer structure made up of the aforesaid Fe layer and the aforesaid Co alloy layer would often have an Fe concentration gradient such that the side of the Fe layer in contact with the Heusler alloy layer 53 grows richest in Fe by diffusion due to the heat treatment. That is, the multilayer structure made up of the underlay magnetic layer 51 and the Fe layer 52 would often have an Fe concentration gradient such that the side of the Fe layer 52 in contact with the Heusler alloy layer 53 grows richest in Fe. Even when there is such a concentration gradient appearing, however, the "pure iron" moiety remains near the joining interface of the Fe layer 52 in contact with the Heusler alloy layer 53: the advantages of the invention are still achievable. Such cases that there is an Fe concentration gradient appearing in the Fe layer 52, too, are included in the possible embodiments of the invention, because the advantages of the invention are still achievable.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3.TiC$). That insulating layer has a thickness of about 0.5 to 20 μm as an example.

Then, a lower shield layer 3 comprising a magnetic material and adapted for a reproducing head is formed on that insulating layer 2. The shield layer 3 has a thickness of about 0.1 to 5 μm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing MR device 5 is formed on the lower shield layer 3.

Although not shown, an insulating film is then formed in such a way as to cover two sides of the MR device and the upper surface of the first shield layer 3. The insulating film is formed of an insulating material such as alumina.

Then, two bias magnetic field-applying layers 6 are formed in such a way as to be adjacent to the two sides of the MR device 5 via the insulating layer. Then, an insulating film 7 is formed in such a way as to be located around the MR device 5 and bias magnetic field-applying layers 6. The insulating film 7 is formed of an insulating material such as alumina.

Then, a second shield layer 8 for the reproducing head, comprising a magnetic material, is formed on the MR device 5, bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer should be about 50 to 300 nm in thickness.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion layer 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin-film coils 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. The "throat height" here means a length (height) from the medium opposite plane 20 to a position at which the two magnetic pole layers start being spaced away.

(Explanation of How the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the MR device 5 with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the MR device 5, there is a change in the magnetization direction of the free layer 50 depending on a signal magnetic field from the recording medium which in turn causes a change in the relative angle between the magnetization direction of the free layer 50 and the magnetization direction of the fixed magnetization layer 30, with the result that there is a change in the resistance value of the MR device. The resistance value of the MR device 5 may be found from a potential difference between the first and second shield layers 3 and 8, i.e., the two electrode layers 3 and 8 at the time when a sense current is passed through the MR device. It is thus possible for the reproducing head to play back the information recorded in the recording medium.

(Explanation of the Head Gimbal Assembly and the Hard Disk System)

The head gimbal assembly and hard disk device according to the embodiment here are now explained.

A slider 210 included in the head gimbal assembly is first explained with reference to FIG. 6. In the hard disk system, the slider 210 is located in such a way as to face a hard disk that is a rotationally driven disk-form recording medium. This slider 210 primarily comprises a substrate 211 built up of a substrate and an overcoat 24 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 6, it causes an air flow passing between the hard disk and the slider 210 to induce lift relative to the slider 210 in the downward y-direction in FIG. 6. This lift in turn causes the slider 210 to levitate over the surface of the hard disk. Note here that the x-direction in FIG. 6 traverses tracks on the hard disk.

Near the end of the slider 210 on an air exit side (the left lower end in FIG. 6), there is the thin-film magnetic head 100 formed according to the embodiment here.

A head gimbal assembly 220 according to this embodiment is now explained with reference to FIG. 7. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 7 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here is now explained with reference to FIGS. 8 and 9, respectively.

FIG. 8 is illustrative of part of the hard disk system, and FIG. 9 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiment While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

The present invention concerning the MR device as described above is now explained in more details with reference to the following specific examples.

EXPERIMENTAL EXAMPLE 1

Such inventive and comparative MR samples as shown in Tables 1-4 were formed by sputtering, and provided for experimentation.

Sample MR-1 of Table 1 is an inventive MR device sample of the type wherein each of the free layer and inner layers includes a Heusler alloy layer, and Fe layers are provided on both planes of each Heusler alloy layer For the details, see Table 1.

Sample MR-2 of Table 2 is an inventive MR device sample of the type wherein only the free layer includes a Heusler alloy layer, and Fe layers are provided on both planes of the Heusler alloy layer. For the details, see Table 2.

Sample MR-3 of Table 3 is an inventive MR device sample of the type wherein only the inner layer includes a Heusler alloy layer, and Fe layers are provided on both planes of the Heusler alloy layer. For the details, see Table 3.

Sample MR-4 of Table 4 is a comparative MR device sample of the type wherein although each of the free layer and inner layers includes a Heusler alloy layer, there is no Fe layer provided on both planes of each Heusler alloy layer. For the details, see Table 4.

TABLE 1

(MR-1: Inventive Ex.)

| Multilayer structure | | Component materials of the layers | Thickness (nm) |
|---|---|---|---|
| Protective layer | | Ru | 10.0 |
| Free layer | | Fe | 0.2 |
| | | Co50Mn27Si23 | 4.0 |
| | | Fe | 0.2 |
| | | Co70Fe30 | 1.0 |
| Nonmagnetic electro-conductive layer | | Cu | 2.2 |
| Fixed magnetization layer | Inner layer | Co30Fe70 | 1.0 |
| | | Fe | 0.5 |
| | | Co50Mn27Si23 | 4.0 |
| | | Fe | 0.5 |
| | | Co70Fe30 | 1.0 |
| | Nonmagnetic intermediate layer | Ru | 0.4 |
| | Outer layer | Co70Fe30 | 5.0 |
| Antiferromagnetic layer | | IrMn | 7.0 |
| Underlay layer | | NiCr | 5.0 |
| | | Ta | 1.0 |

TABLE 2

(MR-2: Inventive Ex.)

| Multilayer structure | | Component materials of the layers | Thickness (nm) |
|---|---|---|---|
| Protective layer | | Ru | 10.0 |
| Free layer | | Fe | 0.5 |
| | | Co50Mn27Si23 | 4.0 |
| | | Fe | 0.5 |
| | | Co70Fe30 | 1.0 |
| Nonmagnetic electro-conductive layer | | Cu | 2.2 |
| Fixed magnetization layer | Inner layer | Co30Fe70 | 13.0 |
| | | Cu | 2.0 |
| | | Co30Fe70 | 13.0 |
| | | Cu | 2.0 |
| | | Co30Fe70 | 13.0 |
| | | Cu | 2.0 |
| | | Co70Fe30 | 1.0 |
| | Nonmagnetic intermediate layer | Ru | 0.4 |
| | Outer layer | Co70Fe30 | 5.0 |
| Antiferromagnetic layer | | IrMn | 7.0 |
| Underlay layer | | NiCr | 5.0 |
| | | Ta | 1.0 |

TABLE 3

(MR-3: Inventive Ex.)

| Multilayer structure | | Component materials of the layers | Thickness (nm) |
|---|---|---|---|
| Protective layer | | Ru | 10.0 |
| Free layer | | Co70Fe30 | 1.0 |
| | | NiFe | 2.0 |
| | | Co70Fe30 | 0.5 |
| | | Cu | 0.2 |
| | | Co70Fe30 | 0.5 |
| | | NiFe | 2.0 |
| | | Co70Fe30 | 1.0 |
| Nonmagnetic electro-conductive layer | | Cu | 2.2 |
| Fixed magnetization layer | Inner layer | Co30Fe70 | 1.0 |
| | | Fe | 0.5 |
| | | Co50Mn27Si23 | 4.0 |
| | | Fe | 0.5 |
| | | Co70Fe30 | 1.0 |
| | Nonmagnetic intermediate layer | Ru | 0.4 |
| | Outer layer | Co70Fe30 | 5.0 |
| Antiferromagnetic layer | | IrMn | 7.0 |
| Underlay layer | | NiCr | 5.0 |
| | | Ta | 1.0 |

TABLE 4

(MR-4: Comp. Ex.)

| Multilayer structure | | Component materials of the layers | Thickness (nm) |
|---|---|---|---|
| Protective layer | | Ru | 10.0 |
| Free layer | | Co50Mn27Si23 | 4.0 |
| | | Co70Fe30 | 1.0 |
| Nonmagnetic electro-conductive layer | | Cu | 2.2 |
| Fixed magnetization layer | Inner layer | Co30Fe70 | 1.0 |
| | | Co50Mn27Si23 | 4.0 |
| | | Co70Fe30 | 1.0 |
| | Nonmagnetic intermediate layer | Ru | 0.4 |
| | Outer layer | Co70Fe30 | 5.0 |
| Antiferromagnetic layer | | IrMn | 7.0 |
| Underlay layer | | NiCr | 5.0 |
| | | Ta | 1.0 |

Each sample shown in the aforesaid tables requires annealing at relatively high temperatures so as to place the Heusler alloy in order.

Sample MR-1 (inventive) of Table 1 was annealed at a temperature of 320° C. into a sample of Example 1.

Sample MR-2 (inventive) of Table 2 was annealed at a temperature of 320° C. into a sample of Example 2.

Sample MR-3 (inventive) of Table 3 was annealed at a temperature of 320° C. into a sample of Example 3.

Sample MR-4 (comparative) of Table 4 was annealed at a temperature of 320° C. into a sample of Comparative Example 1.

Figure 10:
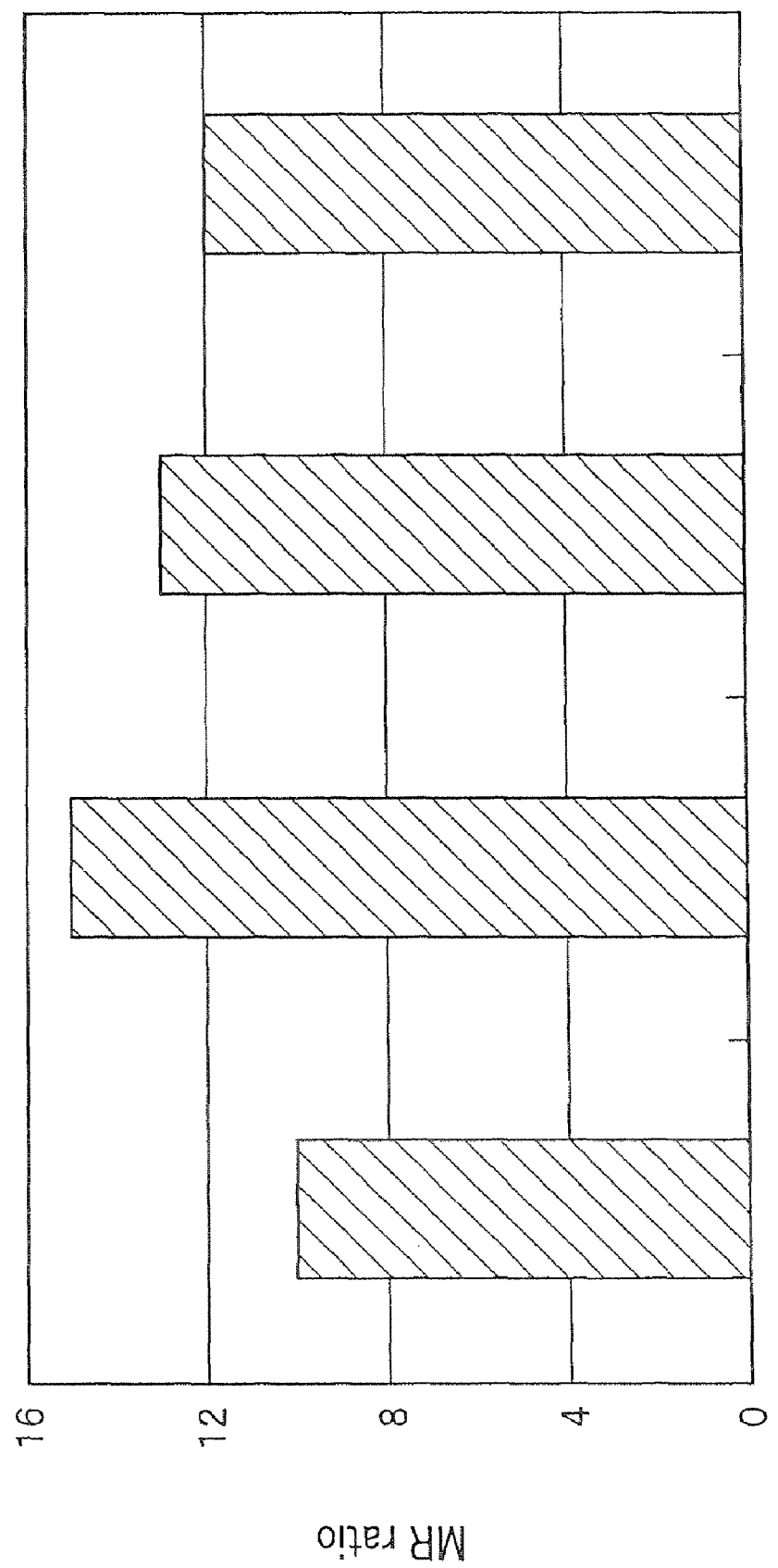
FIG. 10 is indicative, in the form of a bar graph, of the MR ratios for the samples of Inventive Examples 1-3 and Comparative Example 1.

The respective samples after annealing (the samples of Examples 1-3 and Comparative Example 1) were measured for their MR ratios by an ordinary 4-terminal method. The MR ratio is a quotient obtained by dividing the quantity of resistivity change $\Delta R$ by resistance value R, and given by $\Delta R/R$. To make the levels of the found MR ratios visible, the MR ratios of the respective samples (the samples of Examples 1-3 and Comparative Example 1) are shown as a bar graph in FIG. 10. Note here that the MR ratio was worked out as an average of one hundred device samples.

The MR ratio of the sample of Comparative Example 1 was about 10%, whereas those of the samples of Inventive Examples 1, 2 and 3 were about 15%, about 13%, and about 12%, respectively.

The samples deserving direct comparison are those of Comparative Example 1 and Inventive Example 1 wherein the Heusler alloy layers are formed in both the free and the inner layer. Considerations are now taken about these samples.

In the sample of Comparative Example 1, there is the diffusion of Co atoms into the Heusler alloy layer due to the formation of the FeCo alloy layer directly to the Heusler alloy layer interface. This is in sharp contrast to the samples of Inventive Examples 1 and 2 wherein there is no diffusion of Co atoms into the Heusler alloy layer due to the insertion of the Fe layer in the Heusler alloy interface. This layer construction would make the polarizability of the Heusler alloy less likely to go down.

Figure 11:
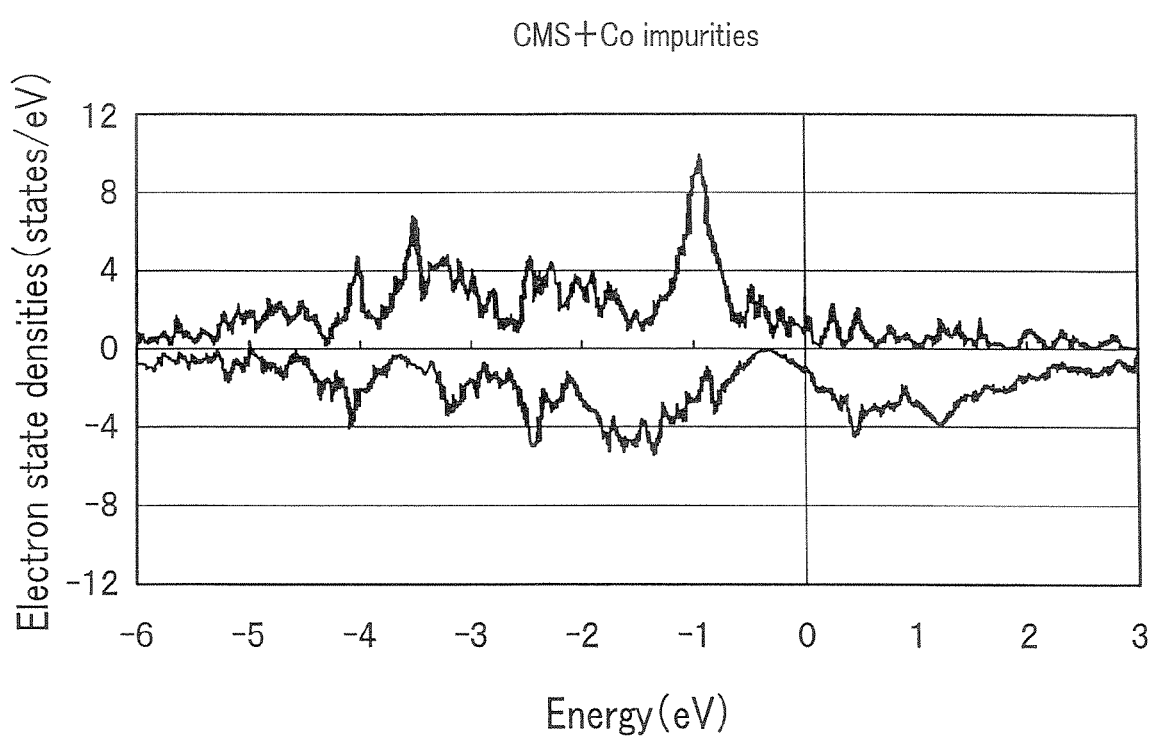
FIG. 11 is a graph indicative of energy (eV) versus electron state density (state/eV) relations in the case where Co impurities diffuse in $Co_2MnSi$ Heusler alloy, entering the Mn site.

FIG. 11 is a graph indicative of energy (eV) versus electron state density (state/eV) relations when Co impurities diffuse into the $Co_2MnSi$ Heusler alloy, entering the Mn site. In the graph of FIG. 11, the upper line is indicative of upspins (upward spins) and the lower is indicative of downspins (downward spins). With no diffusion of Co impurities, the electron state density of downspins near Fermi energy (0 eV) must be zero; however, the electron state density of downspins in FIG. 11 near Fermi energy (0 eV) is not zero, indicating that there is an electron state from Co impurities coming along, lowering the spin polarizability considerably.

Figure 12:
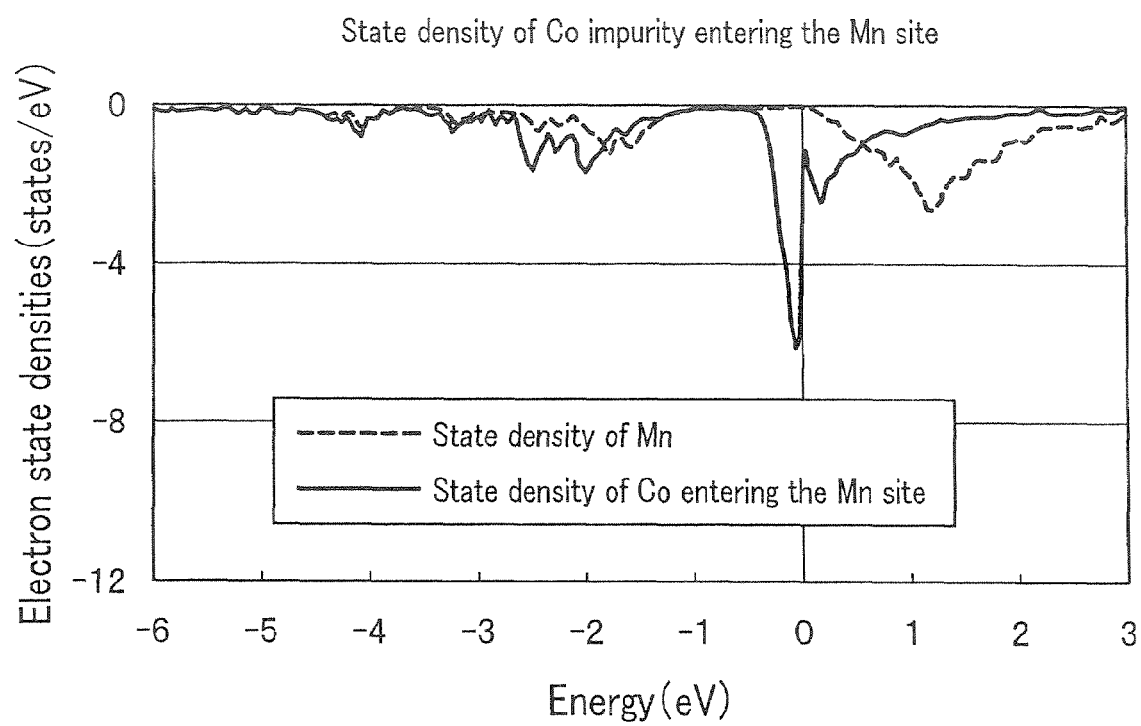
FIG. 12 is a graph indicative of energy (eV) versus electron state density (state/eV) relations on the basis of a sampling of Mn electron state density and electron state density of Co entering the Mn site.

To make sure this, shown in FIG. 12 is a graph indicative of energy (eV) versus electron state density (state/eV) relations based on the electron state density of Mn and the electron state density of Co entering the Mn site, sampled out of the data of FIG. 11. According to this graph, it is seen that Mn has naturally no electron state near Fermi energy (0 eV): it maintains the half-metal property that the Heusler alloy should have by nature. However, the entrance of impurity Co in the Mn site causes the electron state of impurity Co in the Mn site to be conspicuously present at the position of Fermi energy (0 eV), which would be a leading reason for spin polarizability drops.

Figure 13:
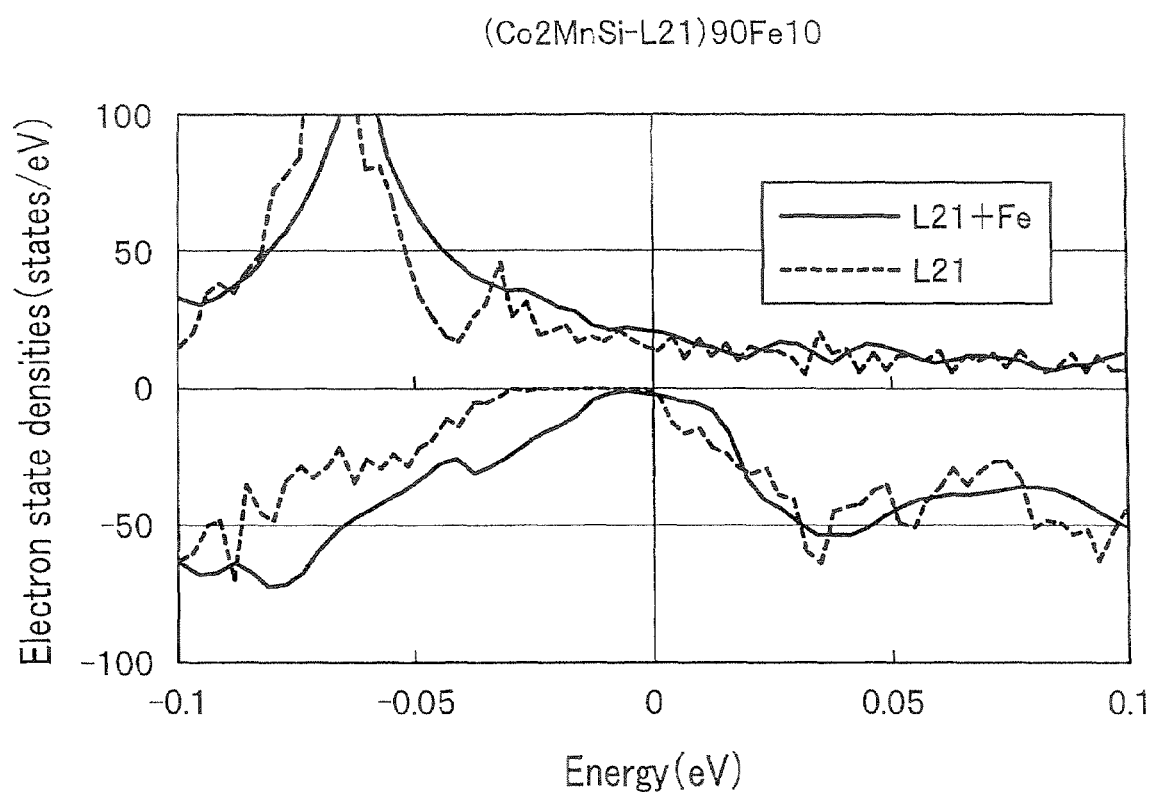
FIG. 13 is a graph indicative of energy (eV) versus electron state density (state/eV) relations between $Co_2MnSi$ Heusler alloys with and without 10% Fe.

FIG. 13 is a graph indicative of energy (eV) versus electron state density (state/eV) relations between the $Co_2MnSi$ Heusler alloy without (line indicated by L21 in FIG. 13) and with 10% Fe (line indicated by L21+Fe in FIG. 13). An electron state density of that alloy upon mixed with 10% Fe is of course thought of as the Mn site being mixed with Fe, in which case the spin polarizability is 70%, a mere 10% decrease from the initial 80%. It follows that Fe would not bring the spin polarizability of the Heusler alloy down to a practically unfavorable level, as compared with Co.

To analyze electronic structure of disordered systems for FIG. 11, FIG. 12, and FIG. 13, the band calculation were performed by using a KKR-CPA-LSD method. The KKR-CPA-LSD method is disclosed in Journal of the Physical Society of Japan Vol. 51, No. 2, February, 1982, pp. 468-474.

While the aforesaid experimentation was performed with $Co_2MnSi$ as the Heusler alloy, similar tendencies have also been confirmed with other Heusler alloys such as $Co_2MnGe$, $Co_2MnSn$, $Co_2MnSb$ and $Co_2Mn(SiGe)$.

The effectiveness of the invention could be appreciated from the aforesaid results.

That is, the present invention provides a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein an Fe layer is formed on one of both planes of said Heusler alloy layer in the stacking direction, wherein said one plane is near to at least a nonmagnetic spacer layer side, and said fixed magnetization layer is made up of a multilayer structure including a Heusler alloy layer, wherein Fe layers are formed on both plane sides of said Heusler alloy layer in the stacking direction with said Heusler alloy layer sandwiched between them. It is thus possible to prevent diffusion of Co atoms contained in the CoFe layer into the Heusler alloy layer, enabling the decrease in the spin polarizability of the Heusler alloy layer to be hold back and achieving a high MR ratio.

Referring here to possible applications to the industry, the present invention could find use in the industry of a hard disk system comprising a magneto-resistive effect device adapted to read the magnetic field strength of a magnetic recording medium or the like in the form of signals.

What we claim is:

1. A magneto-resistive effect device having a current-perpendicular-to-plane structure and having a multilayer structure comprising a fixed magnetized layer, a nonmagnetic spacer layer and a free layer such that said nonmagnetic spacer layer is sandwiched between the fixed magnetized layer and the free layer, with a sense current applied in a stacking direction, wherein:
    said fixed magnetization layer has a multilayer structure comprising a first Co-containing alloy layer, a first Fe barrier layer, a first Heusler alloy layer, a second Fe barrier layer, and a second Co-containing alloy layer, in that order and such that the second Co-containing alloy layer is closest to the nonmagnetic spacer layer;
    said free layer functions such that a magnetization direction changes depending on an external magnetic field, and said free layer has a multilayer structure comprising a third Co-containing alloy layer, a third Fe barrier layer, and a second Heusler alloy layer, in that order and such that the third Co-containing alloy layer is closest to the nonmagnetic spacer layer; and
    said first and second Fe barrier layers inhibit diffusion of Co atoms from the first and second Co-containing alloy layers respectively to the first Heusler alloy layer, and said third Fe barrier layer inhibits diffusion of Co atoms from the third Co-containing alloy layer to the second Heusler alloy layer.

2. The magneto-resistive effect device according to claim 1, wherein said fixed magnetized layer has a multilayer structure comprising an outer layer, a nonmagnetic intermediate layer and an inner layer such that said nonmagnetic intermediate layer is sandwiched between the outer layer and the inner layer and said inner layer is closest to the nonmagnetic spacer layer, and wherein said inner layer comprises the first and second Co-containing layers, the first and second Fe barrier layers, and the first Heusler alloy layer of the fixed magnetized layer.

3. The magneto-resistive effect device according to claim 2, wherein said outer layer comprises a ferromagnetic layer having a fixed magnetization direction, and wherein a magnetization direction of each of said first and second Co-containing layers, said first and second Fe barrier layers, and said first Heusler alloy layer of said inner layer is fixed in a direction opposite to a magnetization direction of the ferromagnetic layer of said outer layer.

4. The magneto-resistive effect device according to claim 3, wherein fixation of the magnetization direction of said ferromagnetic layer of the outer layer is carried out by action of an anti-ferromagnetic layer formed in contact with said outer layer.

5. The magneto-resistive effect device according to claim 1, wherein said nonmagnetic spacer layer is made of an electroconductive material.

6. The magneto-resistive effect device according to claim 1, wherein an Fe concentration gradient within each of the first, second and third Fe barrier layers is highest in Fe at the side of the Fe barrier layer in contact with the Heusler alloy layer.

7. The magneto-resistive effect device according to claim 6, wherein said Fe concentration gradient is obtained by an annealing heat treatment at a temperature higher than 320° C.

8. A thin-film magnetic head, comprising:
    a medium opposite plane in opposition to a recording medium,
    the magneto-resistive effect device according to claim 1 located near said medium opposite plane so as to detect a signal magnetic field from said recording medium, and
    a pair of electrodes for passing a current in a stacking direction of said magneto-resistive effect device.

9. A head gimbal assembly, comprising:
    a slider comprising the thin-film magnetic head according to claim 8 and located in opposition to a recording medium, and
    a suspension adapted to resiliently support said slider.

10. A hard disk system, comprising:
    a slider comprising the thin-film magnetic head according to claim 8 and located in opposition to a recording medium, and
    a positioning device adapted to support and position said slider with respect to said recording medium.

* * * * *